United States Patent [19]
Dubin et al.

[11] Patent Number: 5,695,810
[45] Date of Patent: Dec. 9, 1997

[54] USE OF COBALT TUNGSTEN PHOSPHIDE AS A BARRIER MATERIAL FOR COPPER METALLIZATION

[75] Inventors: Valery M. Dubin, Cupertino, Calif.; Yosi Schacham-Diamand, Ithaca, N.Y.; Bin Zhao, Irvine, Calif.; Prahalad K. Vasudev, Austin, Tex.; Chiu H. Ting, Saratoga, Calif.

[73] Assignees: Cornell Research Foundation, Inc., Ithaca, N.Y.; Sematech, Inc., Austin, Tex.; Intel Corporation, Santa Clara, Calif.

[21] Appl. No.: 754,600

[22] Filed: Nov. 20, 1996

[51] Int. Cl.$^6$ .................. B05D 5/12; B05D 1/18
[52] U.S. Cl. .................. 427/96; 427/98; 427/437; 427/443.1; 437/192; 437/195; 437/230
[58] Field of Search .................. 427/96, 98, 437, 427/443.1; 437/192, 195, 230

[56] References Cited

U.S. PATENT DOCUMENTS

| | | |
|---|---|---|
| 4,574,095 | 3/1986 | Baum et al. |
| 4,789,648 | 12/1988 | Chow et al. |
| 4,894,260 | 1/1990 | Kumasaka et al. |
| 4,985,750 | 1/1991 | Hoshino |
| 5,151,168 | 9/1992 | Gilton et al. |
| 5,240,497 | 8/1993 | Shacham et al. |

FOREIGN PATENT DOCUMENTS

| | | |
|---|---|---|
| 62-270778 | 11/1987 | Japan |

OTHER PUBLICATIONS

"Copper Interconnection with Tungsten Cladding for ULSI;" J.S.H. Cho et al.; VLSI Tech. Symp.; 1991; pp. 39–40.

"Encapsulated Copper Interconnection Devices Using Sidewall Barriers;" Donald S. Gardner et al.; 1991 VMIC Conference; Jun. 11–12, 1991; pp. 99–108.

"Planar Copper–Polyimide Back End Of The Line Interconnections For ULSI Devices;" B. Luther et al.; 1993 VMIC Conference; Jun. 8–9, 1993; pp. 15–21.

"Electroless Cu for VLSI;" James S.H. Cho et al.; MRS Bulletin/Jun. 1993; pp. 31–38.

"Electroless Copper Deposition on Metals and Metal Silicides;" Cecilia Y. Mak; MRS Bulletin/Aug. 1994; pp. 55–62.

"Development Of An Electroless Copper Deposition Bath for Via Fill Applications On TiN Seed Layers;" Roger Palmans et al.; Conf. Proc. ULSI–X; Materials Research Society; 1995; pp. 87–94.

"Selective and Blanket Electroless Cu Plating Initiated By Contact Displacement For Deep Submicron Via Contact Filling;" Dubin et al.; VMIC Conf.; Jun. 27–29, 1995; pp. 315–321.

"0.35 um Cu–Filled Via Holes By Blanket Deposited Electroless Copper On Sputtered Seed Layer;" Yosi Shacham–Diamand et al.; VMIC Conf.; Jun. 27–29, 1995; pp. 334–336.

"Barriers Against Copper Diffusion into Silicon and Drift Through Silicon Dioxide;" Shi–Qing Wang; MRS Bulletin/Aug. 1994; pp. 30–40.

"Inlaid Copper Multilevel Interconnections Using Planarization by Chemical–Mechanical Polishing;" S.P. Murarka et al.; MRS Bulletin/Jun. 1993; pp. 46–51.

"Electrochemically Deposited Diffusion Barrier;" M. Paunovic; et al.; J. Electrochem. Soc., vol. 141 No. 7; Jul. 1994; pp. 1843–1850.

"Electroless Copper Deposition For Multilevel Metallization;" S. Simon Wong et al.; Mat. Res. Soc. Symp. Proc. vol. 203; 1991 Materials Research Society; pp. 347–356.

"Electroless plating of copper at a low pH level;" R. Jagannathan et al.; IBM J. Res. Develop. vol. 37 No. 2; Mar. 1993; pp. 117–123.

"Selective Electroless Metal Deposition for Integrated Circuit Fabrication;" Chiu H. Ting et al.; J. Electronchem. Soc. vol. 136, No.2; Feb. 1989; pp. 456–462.

"Selective Electroless Metal Deposition for Via Hole Filling in VLSI Multilevel Interconnection Structures;" Chiu H. Ting et al.; J. Electrochem. Soc., vol. 136. No. 2; Feb. 1989; pp. 462–466.

"Pd/Si plasma immersion ion implantation for selective electroless copper plating on SiO2;" M.–H. Kiang et al.; Appl. Phys. Lett. 60(22); Jun. 1,1992; pp. 2767–2769.

"Selective electroless Ni deposition on a TiW underlayer for integrated circuit fabrication;" V.M. Dubin et al.; Thin Solid Films, 226(1993); pp. 87–93.

"Copper Corrosion With and Without Inhibitors;" V. Brusic et al.; J. Electrochem. Soc., vol. 138, No. 8; Aug. 1991; pp. 2253–2259.

"100 nm wide copper lines made by selective electroless deposition;" Yosi Shacham–Diamand; J. Micromech. Microeng. 1 (1991); pp. 66–72.

"Passivation of Copper by Silicide Formation In Dilute Siland;" S. Hymes et al.; Conf. Proc. ULSI–VII, Materials Research Society; 1992; pp. 425–431.

"A Half–Micron Pitch Cu Interconnection Technology;" Kazuyoshi Ueno et al.; 1995 Symposium on VLSI Technology Digest of Technical Papers; 1995; pp. 27–28.

"Electroless Metal Deposition From Aqueous Solutions;" V.V. Sviridov; Minsk Bielorussian State University; 1987; pp. 60–85.

*Primary Examiner*—Shrive Beck
*Assistant Examiner*—Bret Chen
*Attorney, Agent, or Firm*—William W. Kidd

[57] ABSTRACT

A technique for electrolessly depositing a CoWP barrier material on to copper and electrolessly depositing copper onto a CoWP barrier material to prevent copper diffusion when forming layers and/or structures on a semiconductor wafer.

21 Claims, 4 Drawing Sheets

USE OF COBALT TUNGSTEN PHOSPHIDE AS A BARRIER MATERIAL FOR COPPER METALLIZATION

BACKGROUND OF THE INVENTION

1. Field of the Invention

The present invention relates to the field of semiconductor manufacturing techniques and, more particularly, to a technique for fabricating a barrier layer for copper metallization.

2. Background of the Related Art

In the manufacture of devices on a semiconductor wafer, it is now the practice to fabricate multiple levels of conductive (typically metal) layers above a substrate. The multiple metallization layers are employed in order to accommodate higher densities as device dimensions shrink well below one micron design rules. Accordingly, the role of interconnects in integrated circuit fabrication is becoming more important with the trend towards higher density at the semiconductor chip level and also with increasing chip die size.

One common metal used for forming metal line interconnects (also referred to as wiring) on a wafer is aluminum. Aluminum is used because it is relatively inexpensive compared to other conductive materials, it has low resistivity and is also relatively easy to etch. In some instances, aluminum is also used as a material for forming plug interconnections in vias, but the trend has been to use tungsten for plugs. However, as the size of interconnect structures are scaled down to sub-micron levels, the line-widths of the interconnects become smaller, causing an increase in the current density for the interconnects. As interconnect shrinkage and current density increase, the electromigration lifetime becomes poor for aluminum interconnects.

An alternative candidate for on chip multilevel interconnections (both wiring and plugs) is copper, since copper has advantages over aluminum and tungsten. For example, copper has lower bulk electrical resistivity and high resistance to electromigration. One technique for depositing copper, as well as other metals, is electroless deposition. In comparison to other copper deposition techniques, electroless copper deposition is attractive due to the low processing cost and high quality of copper deposited. The equipment for performing electroless metal deposition is relatively less expensive, as compared to other semiconductor equipment for depositing metals, and the technique allows for batch processing of wafers. Thus, overall cost can be reduced by using electroless deposition.

In addition, electroless deposition of copper (as well as other metals) offers an advantage in the selective growth of the metal in an interconnect opening (such as a via opening). Selective growth eliminates the need for a polishing or etching step to remove the excess deposited material or reduces the amount of material removal if such a step is required. Techniques for selective deposition are known in the art (See for example, "Electroless Cu for VLSI;" James S. H. Cho et al.; MRS Bulletin; June 1993; pp. 31–38; "Selective Electroless Metal Deposition For Integrated Circuit Fabrication;" Chiu H. Ting et al.; J. Electrochem. Soc., 136; 1989; p. 456 et seq.; "Selective Electroless Metal Deposition For Via Hole Filling In VLSI Multilevel Interconnection Structures;" Chiu H. Ting et al.; J. Electrochem. Soc., 136; 1989; p. 462 et seq.; and U.S. Pat. No. 5,240,497).

Electroless deposition of copper is also described in co-pending patent applications "Electroless Cu Deposition On A Barrier Layer By Cu Contact Displacement For ULSI Applications;" Ser. No. 08/587,262; filed Jan. 16, 1996; "Selective Electroless Copper Deposited Interconnect Plugs For ULSI Applications;" Ser. No. 08/587,263; filed Jan. 16, 1996; and "Protected Encapsulation Of Catalytic Layer For Electroless Copper Interconnect;" Ser. No. 08/587,264; filed Jan. 16, 1996(the above three applications are assigned to the assignees of the present application).

However, one of the drawbacks of using copper metallization is its fast diffusion in silicon materials and drift in $SiO_2$ dielectric materials, which can result in the deterioration of devices. Furthermore, when copper contacts a polymer, such as a polyimide, copper forms a weak chemical bond with the polyimide and diffuse into it to form agglomerates. Thus, the implementation of a diffusion barrier is highly desirable and necessary in most instances.

The poor corrosion resistance of copper is also another important concern. Unlike other metal oxidation (such as aluminum oxidation), copper is readily oxidized to form $Cu_2O$ and $CuO$ at low temperatures (below 200° C.) and no self-protective oxide layer forms to prevent the copper from further oxidation. The oxidized copper degrade the electrical and mechanical properties of the copper interconnect. Accordingly, a protection (or encapsulation) layer of high corrosion resistance material is necessary on the copper surface.

A variety of materials are known for forming diffusion barriers on copper. Such materials include, Ta, W, Mo, TiW, TiN, TaN, WN, TiSiN and TaSiN, which can be deposited by physical vapor deposition (PVD) or chemical vapor deposition (CVD) (See for example, "Barriers Against Copper Diffusion into Silicon and Drift Through Silicon Dioxide;" Shi-Qing Wang; MRS Bulletin; August 1994; pp. 30–40). Copper can also be passivated and protected from corrosion by silicide formation in dilute silane (see for example, "Passivation of Copper by Silicide Formation In Dilute Silane;" S. Hymes et al.; Conf. Proc. ULSI-VII, Materials Research Society; 1992; pp.425–431); by treatment in 1H-benzotriate (see for example, "Copper Corrosion With and Without Inhibitors;" V. Brusic et al.; J. Electrochem. Soc., Vol. 138, No. 8; August 1991; pp. 2253–2259) and by trimethylaluminum treatment (see for example, "A Half-Micron Pitch Cu Interconnection Technology;" Kazuyoshi Ueno et al.; 1995 Symposium on VLSI Technology Digest of Technical Papers; 1995; pp. 27–28).

Furthermore, Ni, Co and Ni-Co alloys can be electrochemically deposited to serve as a diffusion barrier for Cu metallization (see for example, "Electrochemically Deposited Diffusion Barriers;" Paunovic et al.; J. Electrochem. Soc., Vol. 141, No. 7; July 1994; pp. 1843–1850). The Paunovic et al. reference describes a technique for depositing approximately 0.1 μm thick CoP film as a diffusion barrier for Cu up to 400° C. annealing during 14 hours. However, it would be advantageous to employ another material which would have enhanced barrier properties, increased thermal stability, improved corrosion resistance and mechanical properties for use as a diffusion barrier material for copper metallization.

Accordingly, the present invention describes a technique of utilizing electroless deposition to form such an improved barrier layer for protecting or encapsulating copper material.

SUMMARY OF THE INVENTION

The present invention describes a technique of electrolessly depositing CoWP as a barrier material in order to protect or encapsulate a conductive material. In the particular application, the conductive material is copper, which is utilized for forming interconnect structures on a semiconductor wafer. The CoWP material is preferred since copper can be electrolessly deposited on CoWP without the need for activation of the CoWP material surface. Similarly, CoWP can be electrolessly deposited on copper without the need for activating the copper surface for CoWP deposition. Furthermore, the presence of W in CoWP significantly enhances the barrier properties.

When copper is to be deposited on another material for forming an interconnect structure, the CoWP barrier layer is first electrolessly deposited on this underlying material to separate it from the copper. If the underlying material is a dielectric, such as an oxide, the dielectric material is first activated, so that CoWP can be electrolessly deposited. If the underlying material is a catalytic conductive layer, then CoWP can be electrolessly deposited without activation. The copper is then deposited onto the CoWP barrier layer without the need for activation. Subsequently, a second CoWP layer is electrolessly deposited onto the copper to cap the upper surface of the copper. Activation is not required for the CoWP deposition onto the copper.

DETAILED DESCRIPTION OF THE PREFERRED EMBODIMENTS

A technique of electrolessly depositing a CoWP barrier material on to a conductive layer and electrolessly depositing conductive material onto a CoWP barrier layer to form layers and/or structures on a semiconductor wafer is described. In the following description, numerous specific details are set forth, such as specific materials, structures, chemicals, processes, etc., in order to provide a thorough understanding of the present invention. However, it will be appreciated by one skilled in the art that the present invention may be practiced without these specific details. In other instances, well known processes and structures have not been described in detail in order not to obscure the present invention. Furthermore, although the preferred embodiment is described in reference to copper (Cu) deposition, it is appreciated that the copper deposition described is for exemplary purpose only and that the technique of the present invention can be readily adapted to other types of materials, including other metals and alloys.

Additionally, it is appreciated that the fabrication of a multiple-metal layer structure atop a wafer substrate, such as a silicon substrate, to manufacture a semiconductor device is known in the art. Generally, dielectric materials, such as silicon dioxide ($SiO_2$), are utilized to separate the conductive regions. Contact openings are formed in the dielectric overlying the substrate region to provide conductive pathways to the source, drain and gate regions. Via openings are formed in the subsequent inter-level dielectric (ILD) layers separating the various metal layers. Typically, metal and metal alloys are used to provide conductive pathways (plugs and lines) to form the various interconnect layers and structures. One such exemplary multiple metal layer structure is described in "Planar CopperPolyimide Back End Of The Line Interconnections For ULSI Devices;" B. Luther et al.; 1993 VMIC Conference; Jun. 8–9, 1993; pp. 15–21. Accordingly, it is appreciated that the Figures provided herein illustrate only portions of an exemplary semiconductor device which pertain to the practice of the present invention. Thus, the present invention is not limited to the structures described herein.

It is to be appreciated that a slight amount of tungsten is present in the CoWP material in the preferred practice of the present invention. Even though the amount of tungsten present in the CoWP layer is slight, the presence of tungsten does make a difference over just having a CoP film. The presence of tungsten improves the barrier properties by filling in the grain boundaries of the crystalline structure of the CoP film with tungsten atoms. That is, without the presence of tungsten, copper atoms can more easily diffuse through the CoP grain boundaries. However, by having the tungsten present, the tungsten atoms will prevent diffusion along the CoP grain boundaries, therein improving the barrier properties.

In order for copper to be electrolessly deposited onto a surface of a conductive material, such as a metal layer or a barrier layer, the surface of the conductive material must be susceptible to the autocatalytic growth of copper. If the surface is not susceptible to such growth, then the surface must be activated for electroless growth of copper. Without such surface treatment, electroless growth of copper will not occur on a non-catalytic surface, when the wafer is subjected to the electroless copper deposition solution, One technique for activation is to sputter on a catalytic metal, such as copper (see for example, afore-mentioned pending patent application titled "Protected Encapsulation Of Catalytic Layer For Electroless Copper Interconnect;" Ser. No. 08/587,264; filed Jan. 16, 1996). Another technique is the use of contact displacement to activate the conductive surface. The use of palladium (or palladium seeds) is one known contact displacement technique for treating a surface to start the autocatalytic reaction of copper for electroless deposition. (See for example, "Development Of An Electroless Copper Deposition Bath For Via Fill Applications On TiN Seed Layers;" Palmans et al.; Conference Proceedings, ULSIX; materials Research Society; 1995; pp. 87–94). Another is the technique of using copper contact displacement, which is described in the afore-mentioned copending application titled "Electroless Cu Deposition On A Barrier Layer By Cu Contact Displacement For ULSI Applications;" Ser. No. 08/587,262; filed Jan. 16, 1996.

However, these techniques for activating the conductive surface (to form a catalytic layer or a seed layer on the surface) for the electroless deposition of copper require a separate processing step. Only after the surface is activated for copper growth, is the wafer rinsed and subsequently subjected to an electroless deposition solution. The present invention describes a particular barrier material, which is used as a barrier or a protection (encapsulation) layer for copper, and in which this barrier material is also catalytic to the electroless growth of copper. Furthermore, the same barrier material can be deposited electrolessly on copper without the need for activating the copper surface first.

A novel barrier material of the present invention is comprised of cobalt-tungsten-phosphide (CoWP), which is generally in the form of a film layer. The invention allows for an improvement in the barrier properties, increased thermal stability, improved corrosion resistance and mechanical properties (such as wear resistance) of electrolessly deposited barrier/protection layer for electroless copper metallization, as well as to develop a process for selective electroless deposition of such a barrier/protection layer on copper lines and plugs.

Figure 1:
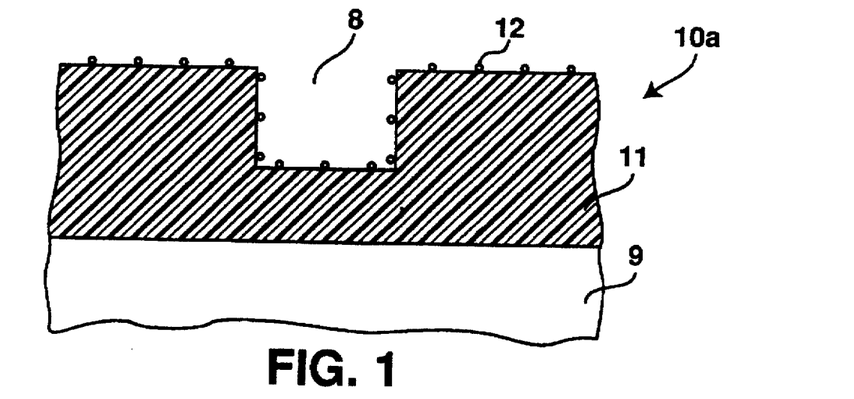
FIG. 1 is a cross-sectional view of a portion of a semiconductor wafer, having a patterned trench opening formed in a dielectric layer, in which an activation layer is deposited by a PVD or CVD process.

Referring to FIG. 1, a portion of a semiconductor wafer 10a is shown in which a dielectric layer 11 is formed either on a substrate or on an underlying layer 9. The dielectric layer 11 is typically an oxide layer used to separate conductive regions or layers of a semiconductor wafer. In a typical silicon semiconductor wafer, silicon oxide ($SiO_2$) is used as a dielectric material for layer 11. FIG. 1 also shows a patterned trench opening 8 formed in the dielectric layer 11. The trench opening 8 will be filled in at a later step to form a metal line (wiring), which will become part of the wiring interconnect structure of wafer 10a. The formation and patterning of such type of layers and structures to form an interlevel-dielectric (ILD)) layer are known in the art. A CoWP barrier or protective layer (hereinafter referred to simply as a barrier layer) of the preferred embodiment will then be deposited on the dielectric layer 11 by electroless deposition. However, since the dielectric layer 11 is not susceptible to electroless growth of the CoWP material, the surface of dielectric layer 11 first needs to be activated for the deposition of CoWP.

As shown in FIG. 1, the surface portions of the dielectric layer 11, which will receive the CoWP growth, are first activated by a metal that allows the electroless deposition of CoWP material to occur. A variety of metals and alloys can be used to activate the surface of dielectric layer 11, but in the preferred technique, cobalt (Co), tungsten (W), palladium (Pd) or platinum (Pt) is used. The activation metal is sputtered onto the surface by a PVD process or deposited by a CVD process to form a seed (or activation) layer 12. Generally, it is preferred to deposit at least a monolayer of such material to form the seed layer 12 on the surface of dielectric layer 11. Of the four materials listed above, it is more preferred to use Co, Pd and Pt than W, since these materials have more desirable catalytic activity for electroless metal deposition.

Figure 2:
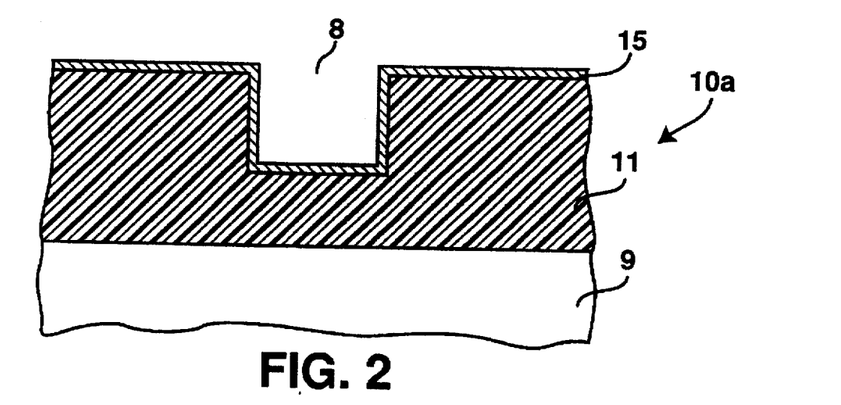
FIG. 2 is a cross-sectional view showing a formation of a CoWP barrier layer of the present invention on the activation layer of FIG. 1 by electroless deposition.

Once the surface of the dielectric layer 11 has been activated, a barrier layer 15 of the present invention is conformally deposited onto the activated surface of the dielectric layer 11, as shown in FIG. 2. The barrier layer 15 is a film layer comprised of CoWP, which is deposited by electroless deposition. As noted above, the technique of electrolessly depositing a metal or a metal alloy (hereinafter, the term metal also includes metal alloys), is known. The wafer 10a is either immersed in a CoWP electroless deposition solution or the solution is sprayed onto the wafer 10a.

It is appreciated that a variety of electroless deposition solutions can be adapted for electrolessly depositing CoWP (see for example, "Thick Selective Electroless-Plated Cobalt-Nickel Alloy Contacts to $CoSi_2$;" Georgiou et al.; J. Electrochem. Soc., Vol. 138, No. 7; July 1991; pp. 2061–2069). However, the preferred electroless CoWP deposition solution is comprised of Co and W compounds with hypophosphite as a reducing agent. The solution is maintained at a temperature of 70°–95° C. and at a pH of 8–11. The particular CoWP solution is comprised of 10 grams/liter of $(NH_4)_2 WO_4$, 30 g/l of $CoCl_26H_2O$, 80 g/l of $Na_3C_6H_4O_7 2H_2O$, 20 g/l of $Na_2H_2PO_2$, 0.05 g/l of RHODAFAC# RE610(manufactured by Rhone-Poulenc) in de-ionized (DI) water. In experimentation, the deposition rate of electroless CoWP was measured to be approximately 35 nm/min., with average surface roughness (Ra) at approximately 4 nm for 150–200 nm thick film. Resistivity of electroless CoWP is estimated to be about 28–32 $\mu\Omega$ cm.

By employing the above solution in an electroless deposition step, the CoWP material is electrolessly deposited onto the seed layer 12 to form the CoWP barrier layer 15. The barrier layer 15 is typically a film layer comprised of Co having an atomic weight percentage of 87%, W having an atomic weight percentage of 2% and P having an atomic weight percentage of 11%. It is appreciated that the percentages noted are approximate. It is generally preferred to have the atomic weight percentage of W in the range of 2–7%. The wafer is then rinsed in DI water to remove the deposition solution.

Figure 3:
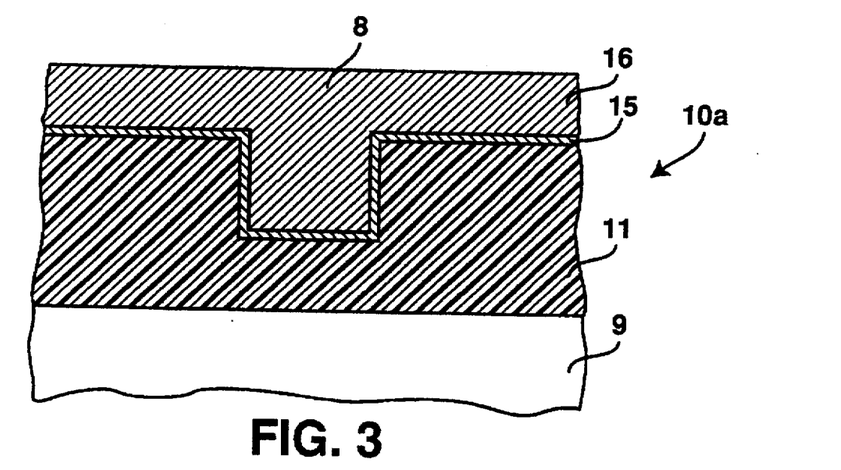
FIG. 3 is a cross-sectional view showing an electroless deposition of copper atop the CoWP barrier layer of FIG. 2 and filling in the trench opening.

FIG. 3 shows the subsequent step of electrolessly depositing copper on the CoWP barrier layer 15 to form a copper layer 16. Since CoWP is catalytic to electroless deposition of copper, the CoWP barrier layer 15 need not be activated. Sufficient thickness of the copper layer 16 is deposited until it fills the trench opening 8. If the disposition of the CoWP barrier layer 15 is not restricted to the trench area 8 only, then CoWP will also be present above the upper surface of the dielectric layer 11. If the barrier layer 15 also resides outside of the trench, copper will also deposit there as well.

One of a variety of known electroless copper deposition solutions can be utilized to electrolessly deposit copper layer 16. However, with the preferred embodiment, the electroless copper deposition is performed in the following solution, which is an electroless copper deposition solution described in the afore-mentioned pending application titled "Electroless Cu Deposition On A Barrier Layer By Cu Contact Displacement For ULSI Applications." The copper layer 16 is electrolessly deposited until a desired thickness of copper forms above the barrier layer 15.

The particular electroless copper deposition solution is comprised of copper sulfate to supply the $Cu^{2+}$ cations, ethylenediaminetetraacetic acid (EDTA) as a complexing agent for $Cu^{2+}$ cations, quaternary ammonium hydroxides or potassium hydroxide (KOH) to supply the $OH^{31}$, formaldehyde (HCHO) or glyoxylic acid as a reducing agent, RHODAFAC RE 610 or polyethylene glycols as a surfactant and wetting agent, and ammonium cyanide or 2,2'-dipyridyl as stabilizer and ductility promoter.

The particular solution concentration for the solution of the preferred embodiment is mixed in DI water and is comprised of 0.016–0.08 mol/liter of copper sulfate (CuSO$_4$), 0.04–0.2 mol/liter of EDTA, 0.13–1 mol/liter of formaldehyde, 0.06–0.2 mol/liter of glyoxylic acid, 0.01 mol/liter of ammonium cyanide, 10–120 parts-per-million (ppm) of 2,2'-dipyridyl, 50–100 ppm of polyethylene glycol and 0.01–10 gm/liter of RHODAFAC RE 610. Also, sufficient tetramethylammonium hydroxide (TMAH) or potassium hydroxide is added to adjust the pH of the solution to a range of 11–13. The electroless bath is maintained at a temperature in the range of 30°–80° C.

The amount of reducing agent and complexing agent are dependent upon the amount of cupric ions present in the solution. Electroless copper deposition reaction can be expressed as:

According to the above equation, the ratio between the components in the solution must be in molar as:

After the electroless deposition of copper, the wafer is rinsed in DI water again to remove the electroless copper deposition solution.

It is to be appreciated that the CoWP barrier layer 15 need not be activated (seeded) for the electroless growth of copper, since CoWP is catalytic to the electroless growth of copper. Hence, a separate activation step to seed the barrier layer 15 is not necessary to electrolessly deposit copper on the layer 15. Likewise, copper is also catalytic to the electroless growth of CoWP, so that a separate activation step is not needed to electrolessly deposit CoWP on copper layer 16, as will be described below.

Figure 4:
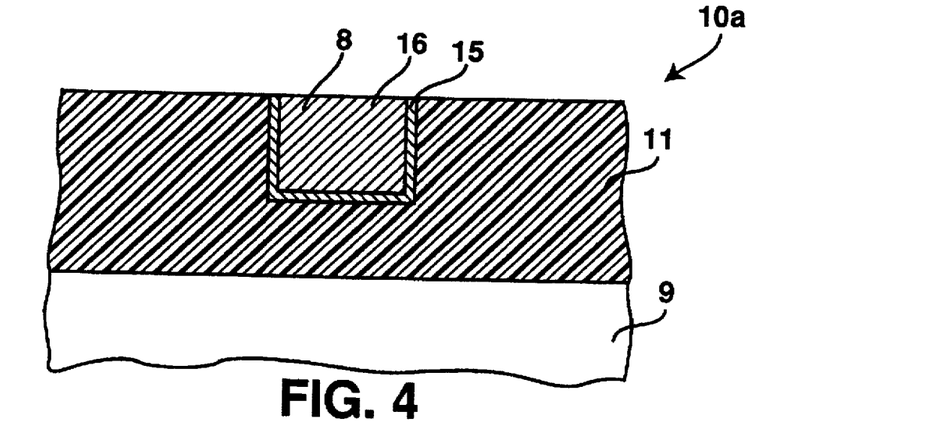
FIG. 4 is a cross-sectional view in which CMP is used to polish away excess copper and CoWP of FIG. 3.

Next, portions of the CoWP barrier layer 15 and the copper layer 16, residing above the trench opening 8 and on the upper surface of the dielectric layer 11, are removed either by etching or CMP, as shown in FIG. 4. The preferred technique is to perform CMP to polish away the excess portions of the layers 15–16, using the dielectric layer 11 as an etch/polish stop. What remains is the copper interconnect structure within opening 8, which is isolated (encapsulated) from the adjacent dielectric (typically SiO$_2$) material by the CoWP barrier material.

Figure 5:
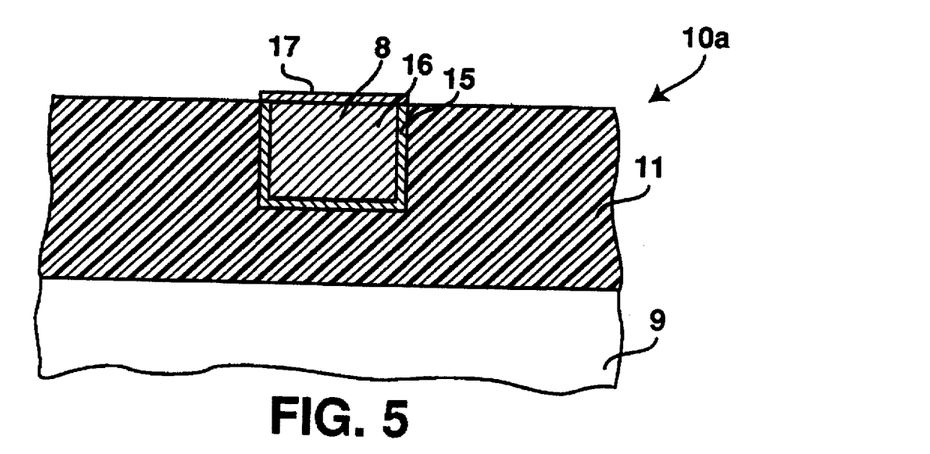
FIG. 5 is a cross-sectional view showing a formation of another CoWP barrier layer of the present invention to cap the copper in the trench of FIG. 4.

Then, as shown in FIG. 5, a second CoWP barrier layer 17 deposition is performed to electrolessly deposit CoWP to cap the copper layer 16. The preferred solution for electrolessly depositing the second barrier layer 17 is the electroless CoWP solution earlier described. Since copper is catalytic to the electroless deposition of CoWP, activation of the copper surface is not required. Then, the wafer is again rinsed.

It is appreciated that the second CoWP layer only forms atop the remaining CoWP and copper layers 15–16, which are present in the trench opening 8. As noted, the barrier layer 15 provides the barrier between the copper 16 and the dielectric layer 11, while the barrier layer 17 provides the barrier between the copper 16 and a layer overlying it. Thus, copper is fully encapsulated and protected from underlying, overlying and adjacent materials.

It is also to be appreciated that the electroless deposition technique described above in reference to FIGS. 1–5 can be utilized for a via opening as well. That is, the via opening in the ILD layer exposes an underlying conductive layer (typically called a metal layer) of a semiconductor wafer. The via opening is subsequently filled to form a plug interconnect, which is used to interconnect the underlying metal layer to a subsequent metal layer formed above the ILD layer and the plug. Such a structure is illustrated in FIG. 6.

Figure 6:
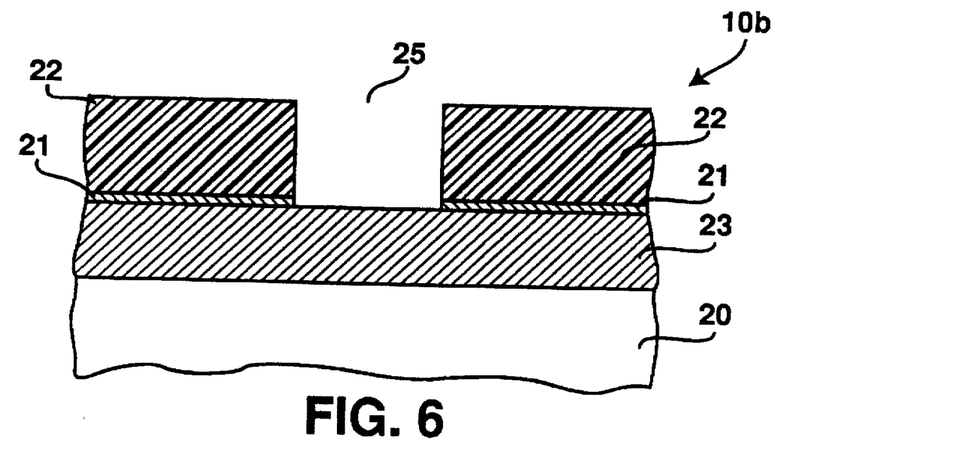
FIG. 6 is a cross-sectional view showing a portion of a semiconductor wafer, having a patterned via opening formed in a dielectric layer, in which an underlying conductive layer is exposed, but also in which a barrier layer overlying the conductive layer in the opening is removed.

Referring to FIG. 6, a portion of a wafer 10b is shown having a conductive layer 23 (again, this layer is typically referred to as a metal layer) formed on an underlying dielectric layer 20. The dielectric layer 20 can be an ILD layer. When current metallization processes are implemented, the conductive layer 23 is usually comprised of an aluminum-copper alloy (Al-Cu). Also shown is a barrier layer 21 residing atop the conductive layer 23. The barrier layer 21 is utilized to form a barrier on the conductive layer 23. Another dielectric layer 22 (typically an ILD layer) resides atop the layers 21 and 23. As shown in the illustration, a via opening 25 is formed in the dielectric layer 22. In this particular example, the via opening 25 is for the formation of a plug interconnect.

Generally, it is preferred to retain the barrier layer 21 at the bottom of the opening 25, but in some instances, the etching process to form the via opening 25 may remove the barrier layer 21 at the bottom of the opening 25, as shown in FIG. 6. In that event, it is typically necessary to reform the barrier material over the exposed portion of the conductive layer 23, before the plug material is deposited to fill the opening 25. Although the replacement of the bottom barrier material can be performed first, the preferred technique is to line the sidewalls of the opening 25 first before the bottom barrier material is replaced.

Figure 7:
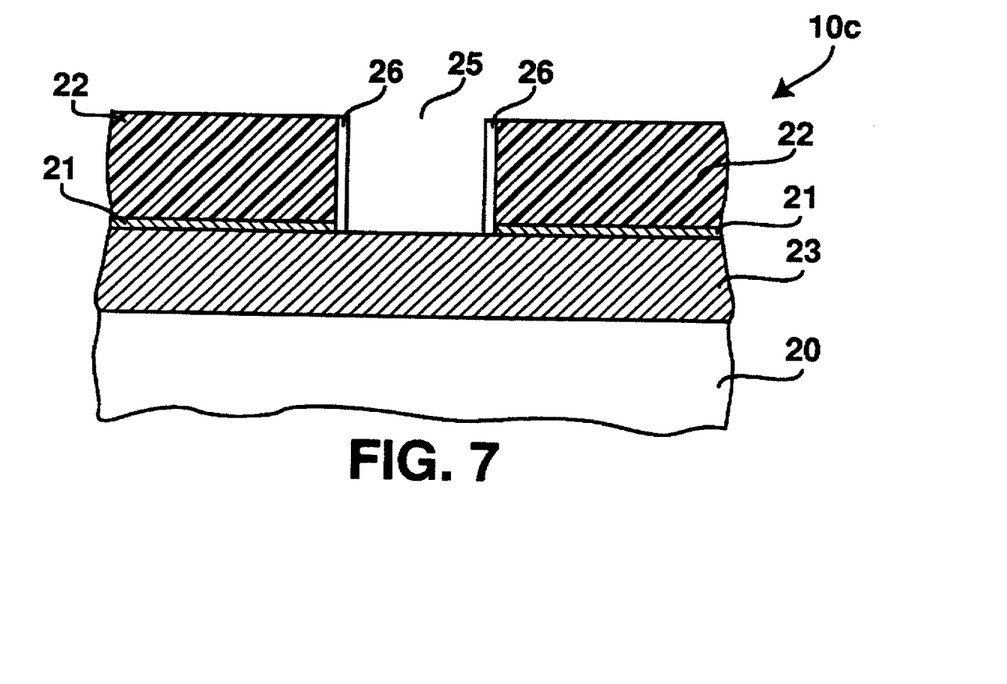
FIG. 7 is a cross-sectional view showing a formation of an encapsulating sidewall within the via opening of FIG. 6.

As shown in FIG. 7, a sidewall barrier 26 is formed along the sidewall of the opening 25. A variety of techniques are known for forming such barrier sidewalls to isolate an interconnect structure which is to be formed within opening 25 from the adjacent dielectric layer 22. One such technique is described in the afore-mentioned pending patent application titled "Selective Electroless Copper Deposited Interconnect Plugs For ULSI Applications," in which silicon nitride (SIN) or silicon oxynitride (SION) is deposited by a chemical vapor deposition (CVD) technique to form the sidewalls 26. It is appreciated that the step(s) for forming the sidewalls 26 may also contribute to the erosion of the barrier layer 21 at the bottom of the opening 25, if any had remained.

Figure 8:
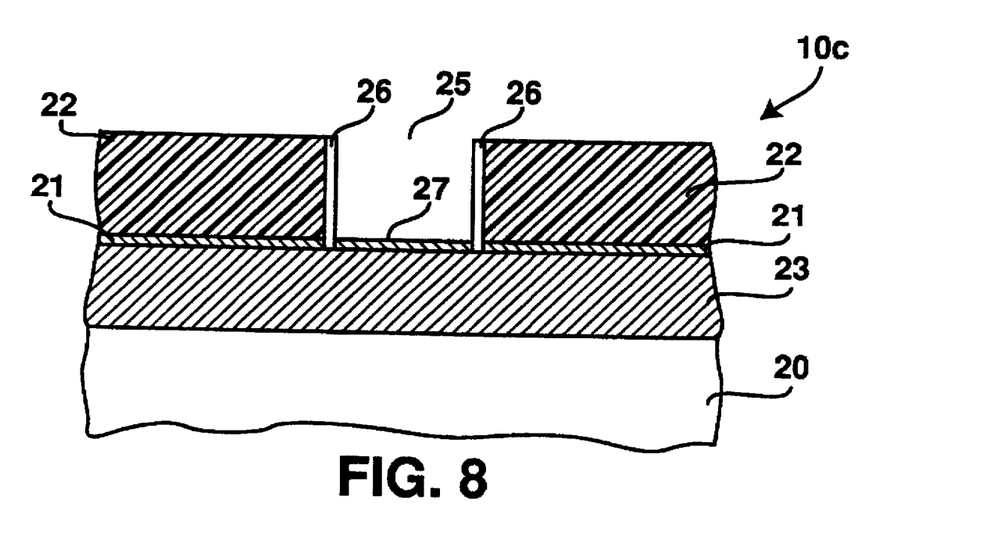
FIG. 8 is a cross-sectional view showing a selective formation of a CoWP barrier layer of the present invention at the bottom of the via opening of FIG. 7.
Figure 9:
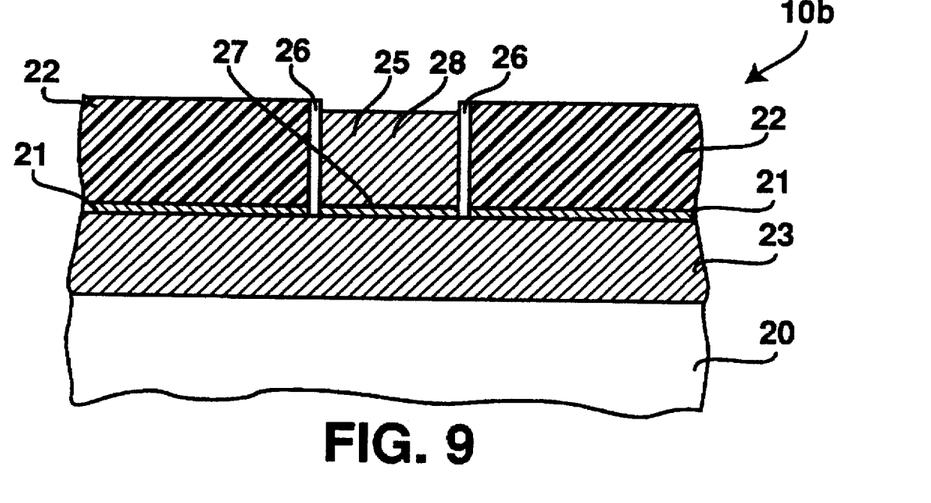
FIG. 9 is a cross-sectional view showing a selective electroless deposition of copper atop the CoWP barrier layer of FIG. 8 to form a copper plug.

Subsequently, as shown in FIG. 8, a CoWP barrier layer 27 is electrolessly deposited employing the CoWP deposition solution noted earlier. Since copper is catalytic to the electroless deposition of CoWP, activation of the Al-Cu conductive layer 23 is not required. Next, as shown in FIG. 9, copper is electrolessly deposited on the CoWP barrier layer 27 to form the copper plug 28, using the electroless deposition technique described earlier for depositing copper on CoWP. Again, CoWP is catalytic to the electroless deposition of copper, so that pretreatment of the barrier layer 27 is not required. Since the electroless deposition is achieved selectively, the growth of the copper plug 28 can be stopped at or below the upper surface of layer 22.

Figure 10:
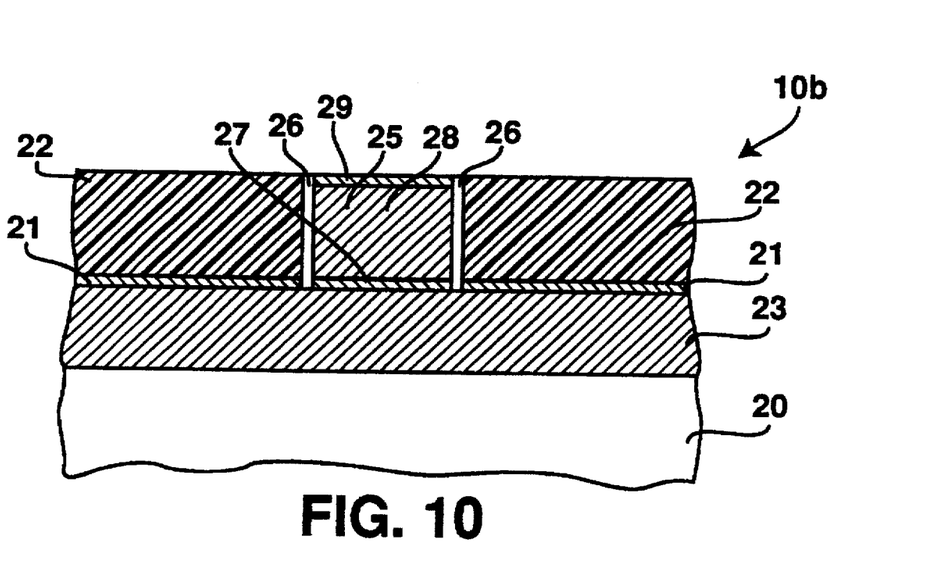
FIG. 10 is a cross-sectional view showing a selective formation of another CoWP barrier layer of the present invention above the copper plug of FIG. 9.

Then, as shown in FIG. 10, the second CoWP barrier layer 29 is electrolessly deposited on the copper 28, in the equivalent technique described earlier in FIG. 5. Again, since the copper is catalytic to the electroless deposition of CoWP, activation of copper is not required. When completed, the two CoWP barrier layers 27 and 29 isolate the copper 28 from its underlying and overlying layers, while the sidewalls 26 isolate the copper 28 from the adjacent ILD layer 22. Thus, the copper plug 28 is fully encapsulated. Note that when the selective deposition of the copper plug 28 is stopped slightly below the upper surface, the CoWP barrier layer 29 can be deposited into the opening 25 so that it's upper surface is approximately level with the surface of the dielectric layer 22.

It is to be emphasized that the copper plug 28 and the CoWP barrier layers 27 and 29 are deposited selectively, so that removal (such as by etching or polishing) of excess material is generally not needed (or if needed, only a touch polish is needed). Accordingly, the present invention can be utilized for blanket or selective deposition of interconnect structures. The present invention can be utilized to provide CoWP barrier of copper for a variety of structures, of which interconnect structures being one example.

It is to be appreciated that the amount of tungsten present in the preferred practice of the present invention is somewhat slight. However, even though the amount of tungsten present in the CoWP layer is slight, the presence of tungsten does make a difference over just having a CoP film. The presence of tungsten in the approximate range of 2–7% (by atomic weight percentage), improves the barrier properties by filling in the grain boundaries of the crystalline structure of the CoP film with tungsten atoms. That is, without the presence of tungsten, copper atoms can more easily diffuse through the CoP grain boundaries. However, by having the tungsten present, the tungsten atoms will prevent copper diffusion along the CoP grain boundaries, therein improving the barrier properties.

Thus, a technique of electrolessly depositing a CoWP barrier material onto copper and electrolessly depositing copper onto a CoWP barrier layer to form copper layers and/or structures on a semiconductor wafer is described. In the specific examples described, copper is being protected (or encapsulated) by the CoWP barrier layer. However, it is understood that other conductive materials can be readily protected by the CoWP barrier material as well and the present invention is not limited to the use of copper. It is preferred that the CoWP barrier layer is deposited on a conductive material which is catalytic to CoWP. However, where such conditions do not exist, the underlying material (whether metal or nonmetal) can be treated (such as by activation) to make the surface susceptible for electroless deposition of CoWP.

We claim:

1. A method of electrolessly depositing copper onto a barrier layer which separates said copper from another layer disposed on an opposite side of said barrier layer from said copper, comprising the steps of:

depositing cobalt-tungsten-phosphide, CoWP, electrolessly on an exposed surface of said another layer to form said barrier layer;

depositing said copper electrolessly.

2. The method of claim 1 wherein said copper forms an interconnect structure on a semiconductor wafer.

3. The method of claim 2 wherein said copper is selectively deposited by electroless deposition.

4. The method of claim 1 wherein said CoWP layer is deposited by subjecting said exposed surface of said another layer to an electroless deposition solution comprised of cobalt and tungsten with hypophosphite as a reducing agent.

5. The method of claim 4 wherein said tungsten in said electroless deposition solution is in the range of 2–7 percent by atomic weight percentage.

6. A method of electrolessly depositing a barrier layer on copper, comprising the steps of:

depositing said copper to form a copper layer;

depositing cobalt-tungsten-phosphide, CoWP, electrolessly on an exposed surface of said copper layer to form said barrier layer.

7. The method of claim 6 wherein said copper layer forms an interconnect structure on a semiconductor wafer.

8. The method of claim 7 wherein said copper is selectively deposited by electroless deposition.

9. The method of claim 6 wherein said CoWP barrier layer is deposited by subjecting said exposed surface of said copper layer to an electroless deposition solution comprised of cobalt and tungsten with hypophosphite as a reducing agent.

10. The method of claim 9 wherein said tungsten in said electroless deposition solution is in the range of 2–7 percent by atomic weight percentage.

11. A method of electrolessly depositing a diffusion barrier layer on a material layer, comprising the steps of:

activating a surface of said material layer for autocatalytic growth of cobalt-tungsten-phosphide, (CoWP), by forming an activation seed layer for CoWP on said surface of said material layer;

depositing CoWP electrolessly on said surface of said material layer to form said diffusion barrier layer.

12. The method of claim 11 wherein said material layer is formed from a dielectric material.

13. The method of claim 12 wherein said seed layer is formed by depositing cobalt, tungsten, palladium or platinum on said dielectric material.

14. The method of claim 13 further including the step of electrolessly depositing copper onto said CoWP diffusion barrier layer.

15. The method of claim 11 wherein said CoWP diffusion barrier layer is deposited by subjecting said surface of said material layer to an electroless deposition solution comprised of cobalt and tungsten with hypophosphite as a reducing agent.

16. The method of claim 15 wherein said tungsten in said electroless deposition solution is in the range of 2–7 percent by atomic weight percentage.

17. A method of electrolessly depositing a diffusion barrier layer on a conductive layer formed on a semiconductor wafer in order to prevent diffusion of atoms between said conductive layer and a subsequent layer deposited onto said diffusion barrier layer, comprising the steps of:

depositing cobalt-tungsten-phosphide, CoWP, electrolessly on said conductive layer to form said diffusion barrier layer;

depositing said subsequent layer over said diffusion barrier layer.

18. The method of claim 17 wherein said conductive layer is catalytic to electroless deposition of CoWP.

19. The method of claim 18 wherein said conductive layer is comprised of copper or a copper alloy.

20. The method of claim 19 wherein said CoWP diffusion barrier layer is deposited by subjecting said surface of said conductive layer to an electroless deposition solution comprised of cobalt and tungsten with hypophosphite as a reducing agent.

21. The method of claim 20 wherein said tungsten in said electroless deposition solution is in the range of 2–7 percent by atomic weight percentage.

* * * * *

UNITED STATES PATENT AND TRADEMARK OFFICE
CERTIFICATE OF CORRECTION

PATENT NO. : 5,695,810
DATED : December 9, 1997
INVENTOR(S) : Dubin et al.

It is certified that error appears in the above-identified patent and that said Letters Patent is hereby corrected as shown below:

Column 2, line 20, "degrade" should be --degrades--.

Column 2, line 32, "Copper can also" should begin a new paragraph.

Column 3, line 15, "The copper is" should begin a new paragraph.

Column 5, line 9, "growth, is" should be --growth is--.

Column 6, line 3 "alloys), is" should be --alloys) is--.

Column 6, line 18, "RHODAFAC#" should be --RHODAFAC$^{TM}$--.

Column 6, line 60, "OH$^{31}$" should be --OH$^-$--.

In the Claims:

Column 10, line 17, "(CoWP)" should be --CoWP--.

Signed and Sealed this

Twenty-fourth Day of February, 1998

Attest:

BRUCE LEHMAN

Attesting Officer

Commissioner of Patents and Trademarks